United States Patent [19]

Nishida et al.

[11] Patent Number: 4,787,615
[45] Date of Patent: Nov. 29, 1988

[54] DEVICE FOR AUTOMATICALLY SUPPLYING/DISCHARGING PHOTOSENSITIVE MATERIAL IN AN INCLINED-TYPE STEP AND REPEAT MACHINE

[75] Inventors: Fumihiko Nishida; Isamu Itoi, both of Kyoto; Masaji Mizuta; Koichi Fujii, both of Uji, all of Japan

[73] Assignee: Dainippon Screen Mfg. Co., Ltd., Kyoto, Japan

[21] Appl. No.: 28,719

[22] Filed: Mar. 20, 1987

[30] Foreign Application Priority Data

Mar. 20, 1986 [JP] Japan ............... 61-63749

[51] Int. Cl.[4] .............................. B65H 5/22
[52] U.S. Cl. ........................ 271/3; 271/11; 271/14; 271/267; 271/184; 271/194; 271/5; 355/14 SH; 355/73; 355/86; 355/95
[58] Field of Search .............. 271/3.1, 5, 11, 14, 271/267, 184, 194; 355/3 SH, 14 SH, 73, 86, 87, 95, 99; 44/117, 121, 225, 751, 752

[56] References Cited

U.S. PATENT DOCUMENTS

| | | | |
|---|---|---|---|
| 3,690,477 | 9/1972 | Nilsson | 271/5 X |
| 4,351,610 | 9/1982 | Skrypek et al. | 355/86 |
| 4,402,592 | 9/1983 | Schon et al. | 355/73 X |
| 4,423,955 | 1/1984 | Powers | 355/99 |
| 4,483,527 | 11/1984 | Hashimoto et al. | 271/5 |
| 4,487,409 | 12/1984 | Orii | 271/11 X |
| 4,565,443 | 1/1986 | Yazaki | 271/5 X |
| 4,571,073 | 2/1986 | Diedrich et al. | 271/5 X |

FOREIGN PATENT DOCUMENTS 6061753 9/1983 Japan .

Primary Examiner—Joseph J. Rolla
Assistant Examiner—David H. Bollinger
Attorney, Agent, or Firm—Lowe Price LeBlanc Becker & Shur

[57] ABSTRACT

A device for supplying/discharging PS plates in an inclined-type step and repeat machine having a rearwardly inclined exposing table which includes a supplying holder disposed on a side of the exposing table for supplying the PS plate thereto, the holder having a surface thereof rearwardly inclined at the same angle with respect to the horizontal as that of a surface of the exposing table, a pair of endless chains respectivley disposed along both side edges of the holder and adapted to move up and down longitudinally of the holder in synchronism with each other, metal support supported by the chains at both ends thereof, support bars also supported by the chains at respective both ends thereof via metal pieces the chains being driven to move up while carrying the PS plate which is being held by the metal support and support bars, and a guide provided on the top of the supplying holder and bent backwardly for guiding upward the plate being discharged.

5 Claims, 4 Drawing Sheets

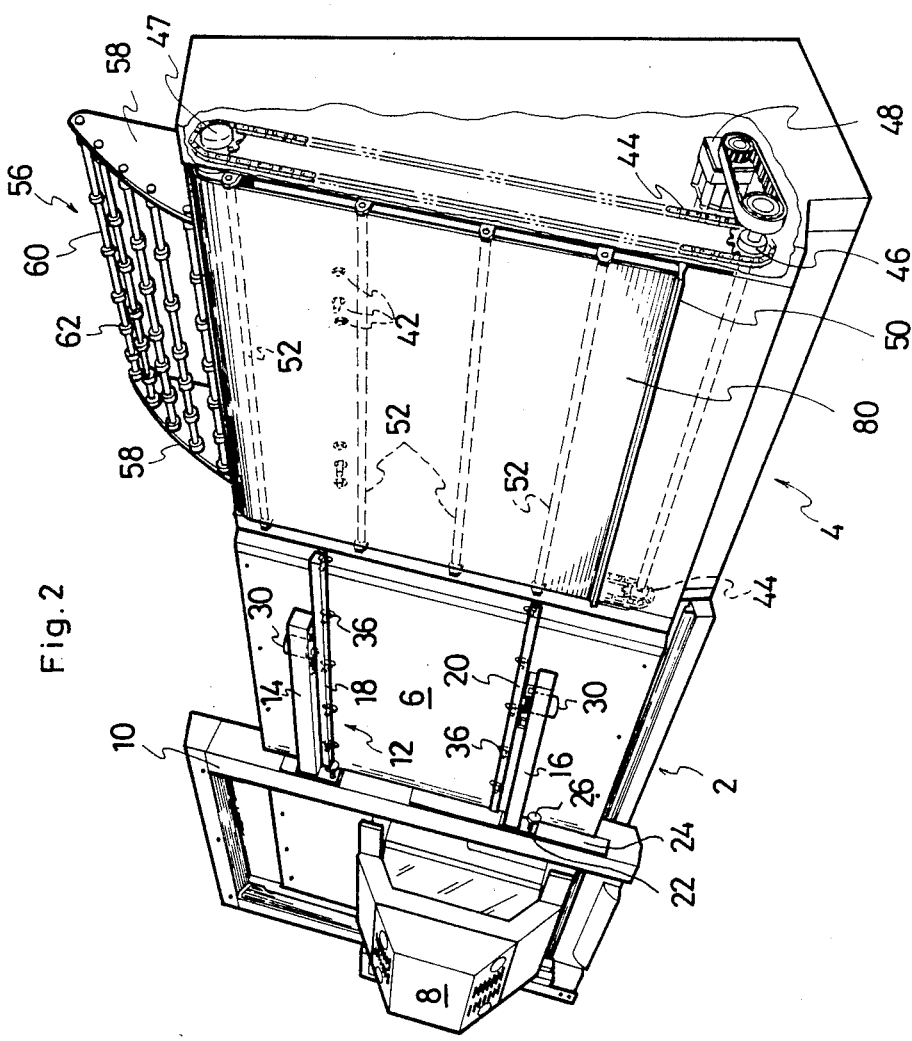

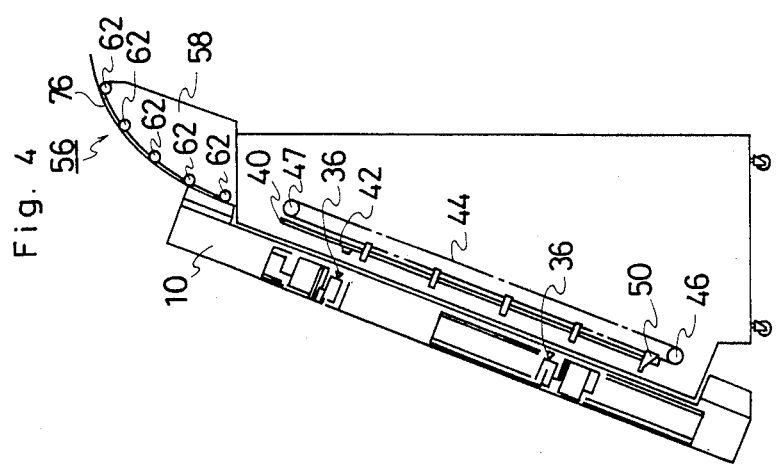
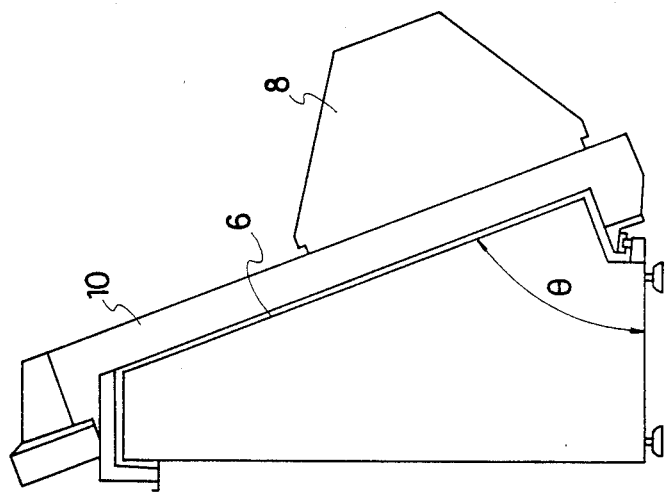

DEVICE FOR AUTOMATICALLY SUPPLYING/DISCHARGING PHOTOSENSITIVE MATERIAL IN AN INCLINED-TYPE STEP AND REPEAT MACHINE

BACKGROUND OF THE INVENTION

1. FIELD OF THE INVENTION

The present invention relates to a device for automatically supplying/discharging photosensitive material such as a presensitized plate (referred to as "PS plate" hereinafter) in an inclined-type step and repeat machine having a rearwardly inclined exposing table.

2. DESCRIPTION OF THE PRIOR ART

Of late, it has been proposed to provide an exposing apparatus of the type having a rearwardly inclined exposing table with a device for automatically supplying thereto/discharging therefrom photosensitive material. One such device is disclosed in Japanese patent application Kokai No. Sho 60-61753. In the conventional device, an installation space is required for equipment that discharges a sensitized plate in addition to that to be occupied by a plate supplying holder furnished to an exposing apparatus.

Such equipment occupies much valuable office space and attempts to reduce the amount of the installation space for the above type of machine have not been very successful.

SUMMARY OF THE INVENTION

With a view to solving the above-identified problem, it is an objective of the present invention to provide a novel and improved device for supplying/discharging photosensitive material in an inclined-type step and repeat machine.

It is another objective of this invention to provide a device for supplying/discharging photosensitive material in an inclined-type step and repeat machine, in which there is achieved a considerable reduction of a required installation space for the machine.

In order to accomplish the above objectives, according to this invention, there is provided a device for supplying/discharging photosensitive material in an inclined-type step and repeat machine having an exposing table with a rearwardly, inclined at an angle greater than 0 to the horizontal, which comprises a supplying holder disposed on a side of the exposing table for supplying photosensitive material thereto, the holder having a surface thereof rearwardly inclined at substantially the same angle with respect to the horizontal as that of the inclined surface of the exposing table; discharging means superposed on the supplying holder for discharging the photosensitive material; and transporting means for transporting the photosensitive material between the exposing table and the supplying holder.

In a preferred embodiment, the discharging means comprises a pair of carrying members respectively disposed along both side edges of the supplying holder and adapted to move up and down longitudinally of the holder in synchronism with each other, and holding members supported by the pair of carrying members being moved up while carrying the photosensitive material which is being held by the holding members so as to discharge the photosensitive material.

Hence, according to the invention, the amount of installation space required for the inclined step and repeat machine can be reduced significantly, since the discharging device is arranged to be superposed on the supplying holder so as to be moved upward in discharging the photosensitive material.

In another preferred embodiment, the transporting means is fixed to a moving frame provided on the body of the step and repeat machine.

Consequently, not only can simplification of the machine be effected, but also, improvements can be made to the accuracy in securing the photosensitive material on the exposing table due to the fact that the transporting means is to move with the same high precision as that with which the moving frame on the body of the machine is moved to perform step and repeat printing.

Preferably, there is provided a guide means on the top of the supplying holder which is bent backwardly for guiding upward the photosensitive material being discharged.

Accordingly, the reduction of the space can be further promoted because of the bent configuration of the guide means which saves a space otherwise required.

The foregoing and other objectives and attendant advantages of the present invention will be readily appreciated as the same becomes better understood by reference to the following detailed description when considered with the accompanying drawings, wherein:

BRIEF DESCRIPTION OF THE DRAWING

FIG. 2 is a partially cutaway perspective view of the machine;

FIG. 3 is a left side elevation view of the body of the machine;

FIG. 4 is a right side elevation view of the supplying-/discharging device, omitting a side board thereof for convenience of illustration;

DETAILED DESCRIPTION OF THE PREFERRED EMBODIMENTS

Figure 1:
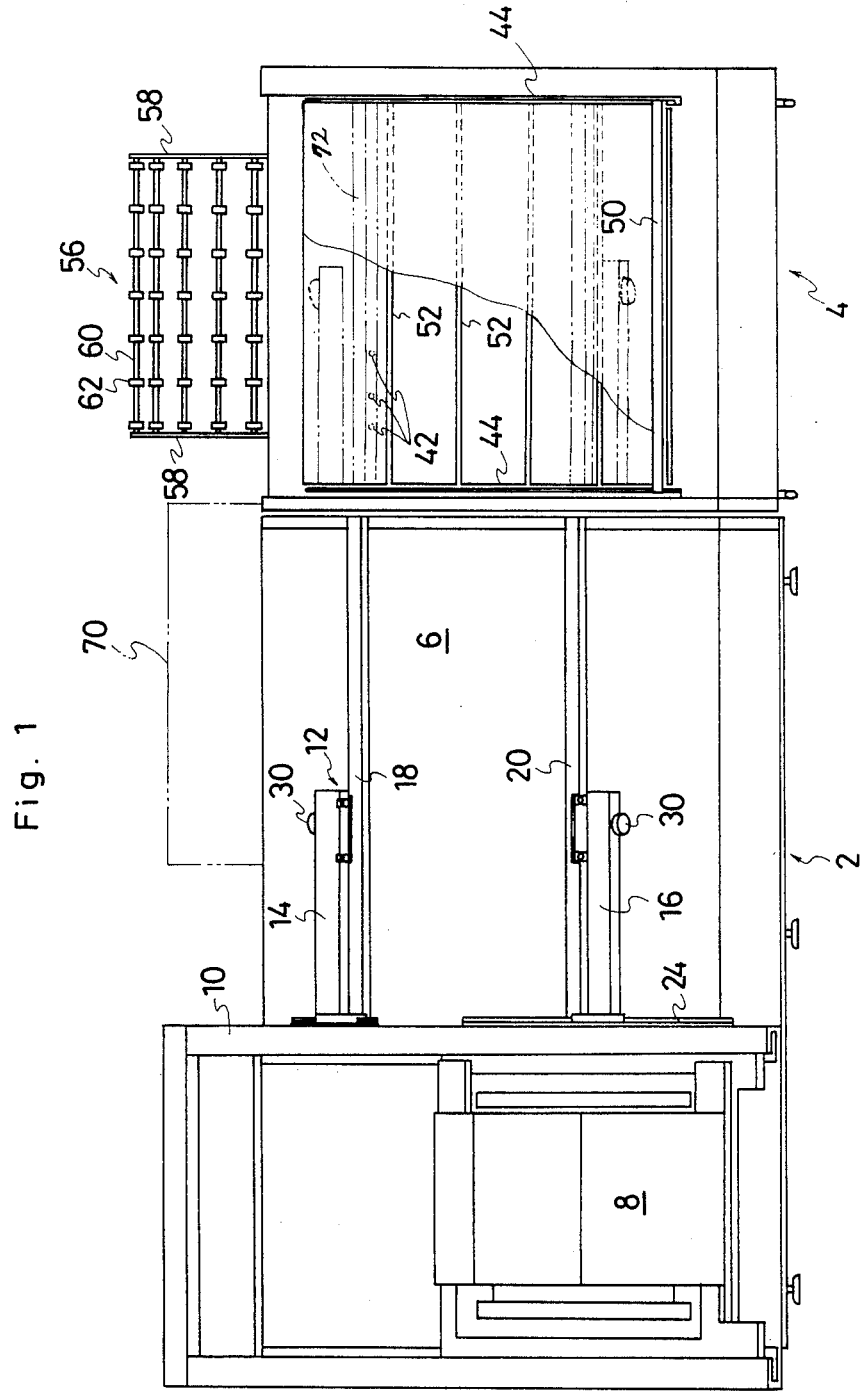
FIG. 1 is an elevation view of an inclined step and repeat machine equipped with a device for supplying-/discharging photosensitive material according to a preferred embodiment of the invention.

Now referring to the drawings, there are described below preferred embodiments of the invention.

FIG. 1 is an elevation view of an inclined step and repeat machine equipped with a supplying/discharging device according to an embodiment of the invention, FIG. 2 is a partially cutaway perspective view of the body of the machine, FIG. 3 is a left elevation side view of the body of the machine, FIG. 4 is a right side elevation view of the device omitting a side board thereof for convenience of illustration, in which 2 denotes the body of the machine and 4 designates the supplying/discharging device.

In FIG. 3, an exposing table 6 on which photosensitive material such as a PS plate is positioned and secured by means of register pins (not shown) is rearwardly inclined at an angle of $\theta$, for example, 70° or so with respect to the horizontal as illustrated in FIG. 3. A light source and an original film holder (not shown) are incorporated in a carrier unit 8 movable up and down on a moving frame 10, which is so designed as to move transversely of the exposing table 6. In step and repeat operations, the original film holder mounted in the carrier unit 8 is moved to a desired position on the PS plate on the exposing table 6 while the frame 10 and the unit 8 are being moved properly, so that the light source repeats the act of exposing through the original film the plate after the original film in the holder (as positioned) is brought into direct contact with the PS plate, thus effecting the printing.

Figure 5:
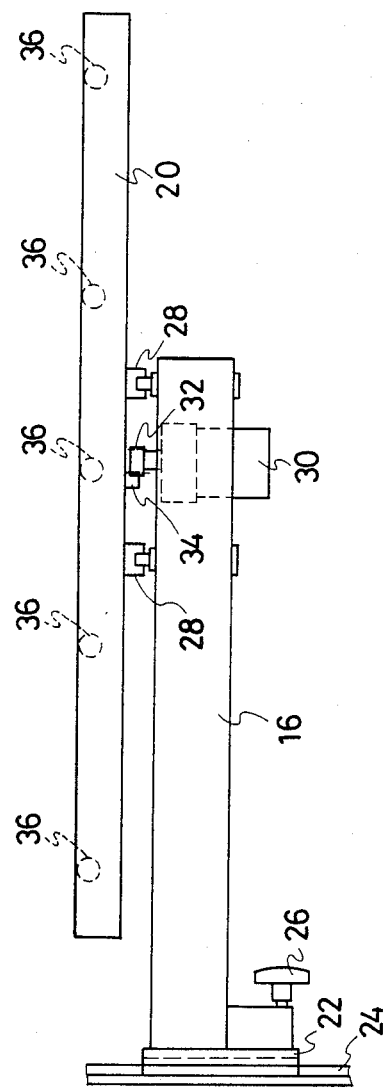
FIG. 5 is a front view showing part of a transporting unit of the supplying/discharging device.

There is provided a transporting unit 12 which is assembled of supporting arms 14, 16 and suction frames 18, 20, and it is moved transversely of the table 6 together with the moving frame 10 while being supported thereby. The supporting arm 16, when a screw 26 secured on a guide member 22 best seen in FIG. 5 is loosened, is movable along a rail 24 longitudinally of the table 6 so as to correspond to different sizes of the PS plates extending in the longitudinal direction of the table 6. The suction frame 20, which is supported by the arm 16 through a pair of guide members 28, is designed for moving perpendicularly to the plane of the table 6 relative to the arm 16 when a rack 34 provided on the frame 20 is moved by a pinion 32 that is driven by a motor 30 mounted on the frame 16. There are provided a plurality of suction members 36, for applying suction to and holding the PS plate, on that face of the frame 20 which confronts the surface of the table 6 as depicted in FIGS. 4 and 5.

The supporting arm 14, like arm 16 is movable longitudinally of the exposing table 6 in order to facilitate securing of the photosensitive material on the exposing table 6 when the transporting unit 12 is not actuated. Furthermore, the suction frame 18 is provided with a plurality of suction members 36 on that face thereof which confronts the surface of the table 6, and is movable vertically to the plane of the table 6 relative to the arm 14 by a motor 30, as in the case of the frame 20. Since the pair of motors 30 is driven to be electrically rotated synchronously, the frames 18, 20 are synchronously moved perpendicularly to the plane of the table 6, relative to the arms 14, 16 respectively, as mentioned above.

Figure 6:
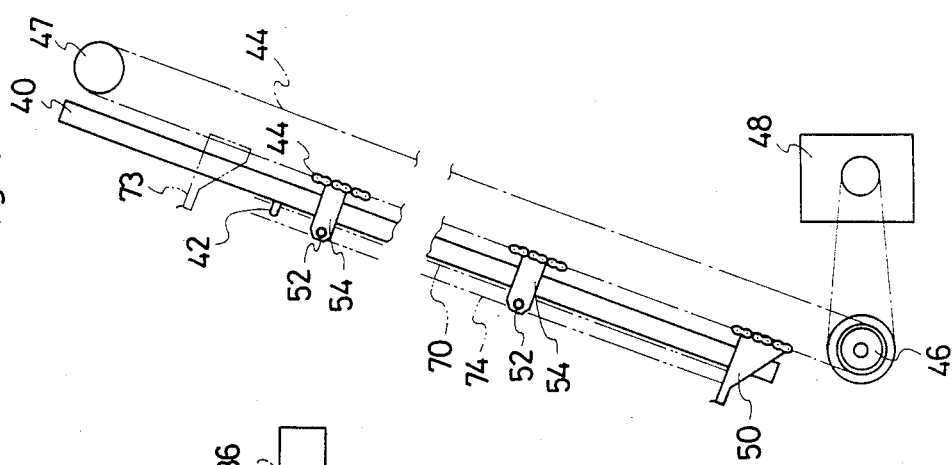
FIG. 6 is a partially enlarged schematic view of the device of FIG. 4.

On a side of the exposing table 6, there is provided a supplying holder 40 for positioning and holding thereon a plurality of PS plates through a plurality of retractable register pins 42. The holder 40 is rearwardly inclined at the same angle as that of the exposing table 6. A pair of endless chains 44 are disposed on both sides of the holder 40, and are driven to move up and down longitudinally of the holder 40 in synchronism with each other by a motor 48 through a sprocket 46 operatively connected thereto, as illustrated in FIG. 6.

A metal support 50, which is supported by the pair of chains 44 at both ends thereof, is provided for the purpose of setting and upholding the lower end of the exposed PS plate being discharged onto the support 50. Furthermore, there are provided support bars 52, for backing the PS plate to be discharged thereonto, which is supported by the pair of chains 44 at both ends thereof via metal pieces 54. The metal support 50 and the support bars 52 are moved up and down longitudinally of the holder 40 by the chains 44. Additionally, as shown in FIG. 3, a rolling rubber sheet 80 is provided over the support bars 52 for protecting unexposed PS plates on the holder 40 while a prior plate being treated to step and repeat printing.

A guide 56 bent backwardly is furnished on the top of the supplying holder 40 for guiding upward the PS plate already treated. The guide 56 is constituted of a plurality of shafts 60 supported by support boards 58 and of a plurality of rollers 62 rotatable about the shaft 60.

Described in detail hereunder are supplying/discharging operations of the aforementioned device of the invention.

Initially, plural PS plates are positioned overlapping one another on the supplying holder 40 with the register pins 42 prior to initiating operation of the device 4 as depicted in FIG. 6, in which only one sheet of PS plate is shown by a broken line 70 for convenience of illustration. When operation of the device 4 is then initiated, the metal support 50 and the support bars 52 are moved up along the surface of the holder 40 by the chains 44 being driven by the motor 48 until the metal support 50 reaches a position indicated by an imaginary line 73 in FIG. 6.

The the moving frame 10 is then moved, in the left-to-right direction in FIG. 1, until the transporting unit 12 arrives at a position shown by broken line 72. Next, the suction frames 18, 20 are driven to come adjacently to the holder 40 by the motor 30, and the uppermost PS plate is sucked and held by the suction members 36 through application of suction and holding forces thereto, and then the frames 18, 20 are moved away from the holder 40, thus taking away the sheet of photosensitive material from the holder 40. Since the metal support 50 and the support bars 52 have been shifted to the upper part of the holder 40 at that time, the PS plate can be taken away without any trouble of difficulty whatsoever. Besides, it may be arranged that the lower suction frame 20 be first moved away from the holder 40 and the upper suction frame 18 be subsequently moved by independently driving the pair of motors 30 respectively associated with the frames, with the PS plate being sucked by the members 36, in order to insure against two PS plates from being taken away simultaneously.

Next, after the transporting unit 12 is moved, in the right-to-left direction in FIG. 1, to a position corresponding to the exposing table 6 by moving the frame 10, the suction frames 18, 20 are driven to come adjacently to the table 6 by motors 30. Subsequently, the PS plate is positioned on the table 6 by register pins (not shown), and is duly secured on tha table 6 by applying vacuum suction to the PS plate. At this time, the metal support 50 and support bars 52 are returned to the positions indicated by said lines in FIGS. 4 and 6 by driving motor 48 to move down the chains 44.

The step and repeat printing thereafter is performed as desired in the same way as is done conventionally, while the moving frame 10 and the carrier unit 8 are being properly moved. After completion of the printing, the transporting unit is restored to the position where the PS plate was transported and secured on the table 6 by means of the unit 12 while the frame 10 was being moved, and, thereafter, the PS plate undergoing the exposing treatment is sucked and held by the suction frames 18, 20. Subsequently, the transporting unit 12 is moved to the position designated by the broken line 72 in FIG. 1 while the frame 10 being moved, and the frames 18 and 20 are shifted somewhat toward the supplying holder 40. Then, the PS plate sucked and held by the suction members 36 is discharged onto the support bars 52 by supplying the members 36 with air, so that the PS plate is backed by the bars 52 and upheld by the metal support 50 at the lower end thereof, as illustrated by the broken line 74 in FIG. 6.

Next, the metal support 50 and the support bars 52 are driven to move up by the chains 44 so as to permit the suction frames 18, 20 to suck and hold another PS plate to be treated subsequently. Meanwhile the treated plate is carried upward while being held by the metal support 50 and the support bars 52. After the bars 52 pass a sprocket 47, however, the PS plate is moved up while being supported by rollers 62 of the guide 56 on its back, being bent rearwardly along the rollers 62 by its own weight as in the state depicted by reference numeral 76 in FIG. 4.

Thus, repeating the above supplying/discharging operations a required number of times leads to the accomplishment of the desired step and repeat printing of plural PS plates.

Besides, it is preferable that the metal support 50 be adjusted in regard to its position in the longitudinal direction of the supporting holder 40, ahead of discharging the PS plate thereonto, correspondingly to that position of the supporting arm 16 which is to be freely set in dependence on the different sizes of the PS plates extending longitudinally of the exposing table 6.

Although the transporting unit 12 is fixed to the moving frame 10 of the body 2 of the step and repeat machine in the foregoing embodiment, the unit 12 may be arranged to be separated and to move independently to the moving frame 10. Additionally, a timing belt may be employed as a carrying member instead of the endless chains 44, provided that the arrangement of the carrying member is made such that the holding members like the metal support 50 and support bars 52 are not projected over the top of the holder 40 while being moved up, so as to effect space-saving upward of the top.

Furthermore, although the inclination of the exposing table 6 and the supporting holder 40 with respect to the horizontal is 70 in the aforementioned embodiment, it may be freely determined within the range of below 90° in so far as the amount of an installation space occupied by the machine is not great by too small an angle thereof.

While the preferred embodiments of the present invention have been described above, it should be understood that various modifications may be made thereto by person skilled in the art without departing the spirit of the invention and the scope of the appended claims.

What is claimed is:

1. A device for automatically supplying/discharging photosensitive material in an inclined-type step and repeat machine comprising:

an exposing table having a surface that is rearwardly inclined at an angle of more than zero degrees relative to the horizontal for exposing photosensitive material thereon;

a supplying holder disposed on a side of said exposing table for supplying thereto photosensitive material yet to be exposed, said holder having a surface thereof rearwardly inclined at substantially the same angle relative to the horizontal as that of said surface of said exposing table;

discharging means disposed in spatially superposed relation to said supplying holder for discharging exposed photosensitive material outside of said device; and transporting means for transporting said photosensitive material yet to be exposed from said holder to said exposing table and transporting said exposed photosensitive material from said exposing table to said discharging means.

2. A device as claimed in claim 1, wherein said discharging means comprises a pair of carrying members respectively disposed along both side edges of said holder and adapted to move up and down longitudinally of said holder in synchronism with each other, and holding members supported by said pair of carrying members at respective both ends thereof, said carrying members being moved up while carrying the photosensitive material which is being held by said holding members so as to discharge the photosensitive material.

3. A device as claimed in claim 1, wherein said transporting means is fixed to a moving frame provided on the exposing table of the inclined-type step and repeat machine.

4. A device as claimed in claim 1, further comprising a guide means provided on the top of said supplying holder and bent backwardly for guiding upward the photosensitive material being discharged.

5. A device as claimed in claim 1, wherein:

said discharging means receives said exposed photosensitive material from said transporting means when said discharging means is located at a first position relative to said inclined surface of said holder and moves upward along said inclined surface of said holder until said discharging means reaches a second position relative to said surface of said holder, so as to discharge said exposed photosensitive material outside said device, and said transporting means transports said yet to be exposed photosensitive material from said holder to said exposing table when said discharging means is located at said second position.

* * * * *